United States Patent
Ye et al.

(10) Patent No.: US 11,262,967 B2
(45) Date of Patent: Mar. 1, 2022

(54) DISPLAY DEVICE AND TILED DISPLAY DEVICE INCLUDING THE SAME

(71) Applicant: SAMSUNG DISPLAY CO., LTD., Yongin-si (KR)

(72) Inventors: Byoung Dae Ye, Yongin-si (KR); Jun Woo You, Seongnam-si (KR); Dong Hyeon Lee, Seoul (KR); Tae Ho Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/908,813

(22) Filed: Jun. 23, 2020

(65) Prior Publication Data

US 2021/0132891 A1    May 6, 2021

(30) Foreign Application Priority Data

Nov. 4, 2019 (KR) .......................... 10-2019-139805

(51) Int. Cl.
| | |
|---|---|
| *G06F 3/14* | (2006.01) |
| *H01L 51/52* | (2006.01) |
| *G09G 3/3266* | (2016.01) |
| *G09F 9/302* | (2006.01) |
| *G09G 3/3275* | (2016.01) |

(52) U.S. Cl.
CPC .......... *G06F 3/1446* (2013.01); *G09F 9/3026* (2013.01); *G09G 3/3266* (2013.01); *G09G 3/3275* (2013.01); *H01L 51/5237* (2013.01); *G09G 2300/026* (2013.01)

(58) Field of Classification Search
CPC ... G06F 3/1446; G09F 9/3026; G09G 3/3266; G09G 3/3275; G09G 2300/026; H01L 51/5237
See application file for complete search history.

(56) References Cited

U.S. PATENT DOCUMENTS

| | | | |
|---|---|---|---|
| 5,805,117 A * | 9/1998 | Mazurek | G02F 1/13336 345/1.3 |
| 6,897,855 B1 | 5/2005 | Matthies et al. | |
| 7,250,930 B2 | 7/2007 | Hoffman et al. | |
| 2004/0108806 A1 | 6/2004 | Cok et al. | |
| 2010/0079713 A1* | 4/2010 | Asuma | G02F 1/136227 349/139 |
| 2015/0048349 A1* | 2/2015 | Kawata | H01L 27/323 257/40 |
| 2017/0047042 A1* | 2/2017 | Hu | G09G 3/3266 |
| 2017/0062547 A1* | 3/2017 | Mathew | H01L 51/0096 |

(Continued)

FOREIGN PATENT DOCUMENTS

| | | |
|---|---|---|
| KR | 10-0666636 | 1/2007 |
| KR | 10-2007-0062742 | 6/2007 |
| KR | 10-2014-0120180 | 10/2014 |

*Primary Examiner* — Chanh D Nguyen
*Assistant Examiner* — Ngan T. Pham-Lu
(74) *Attorney, Agent, or Firm* — F. Chau & Associates, LLC

(57) ABSTRACT

A display device includes, a substrate, a pixel circuit disposed on the substrate, a light emitting element connected to the pixel circuit and, that emits light toward the substrate, an encapsulation layer that covers the light emitting element, and a panel driver disposed on the encapsulation layer and electrically connected to the pixel circuit through a via line that penetrates the encapsulation layer.

18 Claims, 4 Drawing Sheets

(56) References Cited

U.S. PATENT DOCUMENTS

2018/0061376 A1\* 3/2018 Aoki ................. G09G 5/397
2018/0123086 A1\* 5/2018 Oh .................. H01L 27/3262
2021/0124441 A1\* 4/2021 Ding ................. G06F 3/042

\* cited by examiner

DISPLAY DEVICE AND TILED DISPLAY DEVICE INCLUDING THE SAME

CROSS-REFERENCE TO RELATED APPLICATION(S)

This application claims priority under 35 USC § 119 from, and the benefit of, Korean Patent Application No. 10-2019-0139805, filed on Nov. 4, 2019 in the Korean Intellectual Property Office (KIPO), the contents of which are herein incorporated by reference in their entirety.

BACKGROUND

1. Technical Field

Embodiments are directed to a display device. More particularly, embodiments are directed to a tiled display device that includes including a plurality of display devices.

2. Discussion Of the Related Art

A display device includes a display region that displays an image and a non-display region disposed adjacent to the display region and that does not display an image. A panel driver that drives pixels disposed in the display region is typically disposed in the non-display region.

To implement a large screen, a tiled display device is formed that includes a plurality of display devices arranged in a matrix. The plurality of display devices included in a tiled display device may display one large image or display a plurality of different images. When an area of a bezel or a non-display region of an edge of each of the display devices is large, a user can perceive a boundary between the display devices of the tiled display device, and thus, image quality of the tiled display device is reduced.

SUMMARY

Embodiments provide a display device in which an area of a non-display region is reduced.

Embodiments provide a tiled display device in which a boundary between display devices is not perceived.

A display device according to embodiments includes a substrate, a pixel circuit disposed on the substrate, a light emitting element connected to the pixel circuit and that emits light toward the substrate, and a panel driver disposed that is electrically connected to the pixel circuit through a via line, where the light emitting element does not overlap the pixel circuit.

In an embodiment, the substrate is transparent.

In an embodiment, the light emitting element includes a pixel electrode connected to the pixel circuit, an emission layer disposed on the pixel electrode, and a common electrode disposed on the emission layer.

In an embodiment, the pixel electrode transmits light, and the common electrode reflects light.

In an embodiment, a thickness of the common electrode is greater than a thickness of the pixel electrode.

In an embodiment, the via line may penetrates the common electrode, and a via insulation portion is formed between the via line and the common electrode.

In an embodiment, the pixel circuit includes a transistor, and the transistor includes an active layer that includes a channel region, a source region, and a drain region, a gate electrode that overlaps the channel region, and a source electrode and a drain electrode respectively connected to the source region and the drain region.

In an embodiment, the via line includes a first via line that transmits a scan signal and a second via line that transmits a data signal.

In an embodiment, the first via line is connected to the gate electrode, and the second via line is connected to the source electrode.

In an embodiment, the panel driver overlaps the light emitting element.

In an embodiment, the display device further includes an encapsulation layer that covers the light emitting element, where the panel driver is disposed on the encapsulation layer and the via line penetrates the encapsulation layer.

In an embodiment, the panel driver includes a printed circuit board disposed on the encapsulation layer and a driving chip disposed on the printed circuit board.

In an embodiment, the display device further includes a pad disposed between the encapsulation layer and the printed circuit board. The pad connects the via line to the printed circuit board.

In an embodiment, the via line and the pad are integrally formed.

In an embodiment, the encapsulation layer includes a first inorganic encapsulation layer that covers the light emitting element, an organic encapsulation layer disposed on the first inorganic encapsulation layer, and a second inorganic encapsulation layer disposed on the organic encapsulation layer.

A display device according, to embodiments includes a substrate, a plurality of pixels disposed on the substrate, where each pixel emits light toward the substrate, an encapsulation layer that covers the plurality of pixels, and a panel driver disposed on the encapsulation layer and that is electrically connected to the plurality of pixels through a plurality of via lines that penetrate the encapsulation layer.

In an embodiment, each of the plurality of pixels includes a pixel circuit disposed on the substrate and a light emitting element connected to the pixel circuit and that emits light toward the substrate.

In an embodiment, the panel driver is electrically connected to the pixel circuit of each of the plurality of pixels through each of the plurality of via lines.

A tiled display device according to embodiments includes a plurality of display panels connected to each other and each including a substrate, a pixel circuit disposed on the substrate, a light emitting element connected to the pixel circuit and that emits light toward the substrate and an encapsulation layer that covers the light emitting element, and a plurality of panel drivers where each panel driver is disposed on the encapsulation layer and is electrically connected to the pixel circuit through a respective via line that penetrates the encapsulation layer.

In an embodiment, the plurality of display panels do not overlap each other.

In a display device according to embodiments, a light emitting element emits light toward the substrate, and a panel driver is disposed on the encapsulation layer and electrically connected to the pixel circuit through via lines that penetrate the encapsulation layer, so that a bottom emission type display device in which an area of a non-display region is reduced is provided.

A tiled display device according to embodiments includes a plurality of bottom emission type display devices in which an area of a non-display region is reduced because the panel driver is disposed on the encapsulation layer, so that a bottom emission type tiled display device is provided in which a boundary between the display devices is not perceived.

DETAILED DESCRIPTION OF THE EMBODIMENTS

Hereinafter, display devices and tiled display devices in accordance with embodiments will be explained in detail with reference to the accompanying drawings.

Figure 1:
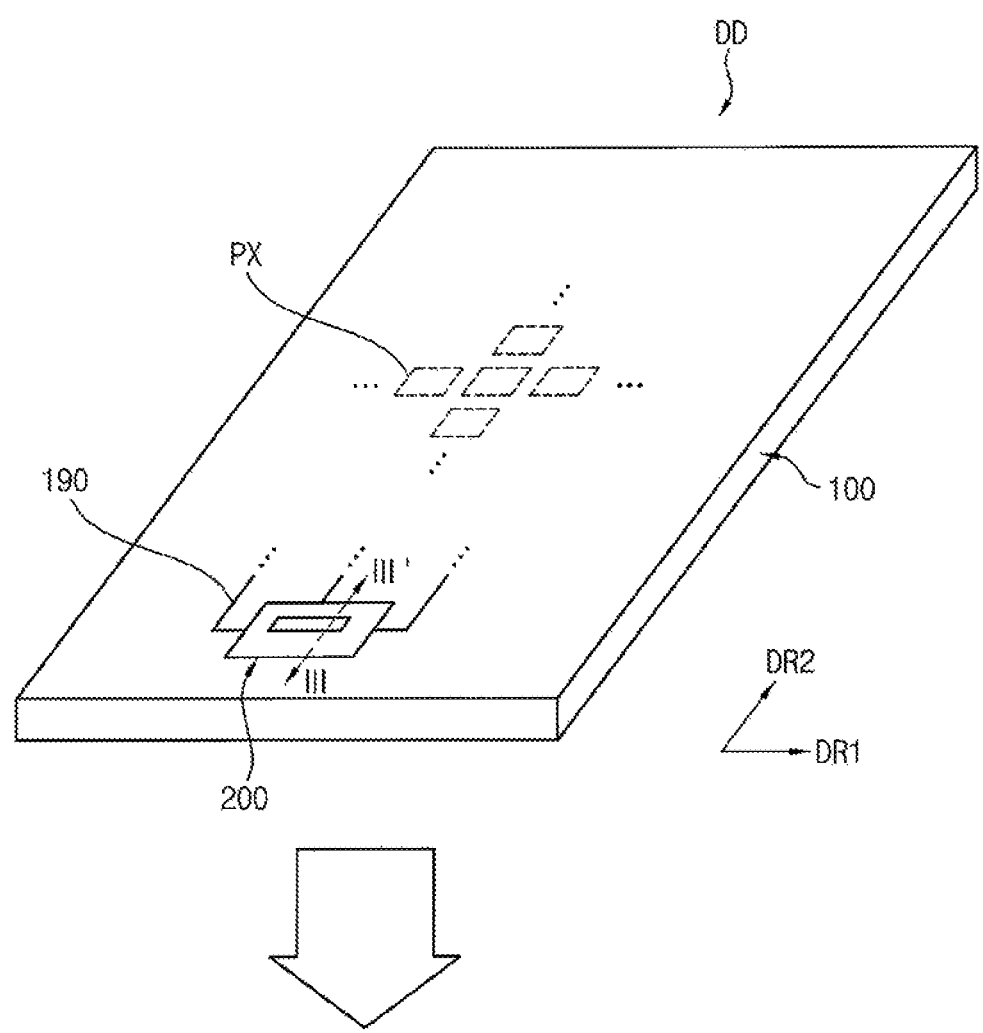
FIG. 1 is a perspective view of a display device according to an embodiment of the present disclosure.

FIG. 1 is a perspective view of a display device according to an embodiment of the present disclosure.

Referring to FIG. 1, a display device DD according to an embodiment of the present disclosure includes a display panel 100 and a panel driver 200.

According to an embodiment, the display panel 100 includes a substrate that is parallel to a plane defined by a first direction DR1 and a second direction DR2 that crosses the first direction DR1, a plurality of pixel PX disposed on the substrate, and an encapsulation layer that covers the pixels PX. The pixels PX are arranged on the substrate along the first direction DR1 and the second direction DR2, Each of the pixels PX emits light toward the substrate.

According to an embodiment, each of the pixels PX includes a pixel circuit disposed on the substrate and a light emitting element connected to the pixel circuit. The light emitting element emits light toward the substrate.

According to an embodiment; the display panel 100 can display an image from the light emitted toward the substrate from each of the pixels PX. In other words, the display panel 100 is a bottom emission display panel in which a bottom surface thereof is a display surface.

According to an embodiment, the display panel 100 may be any one of various display panels, such as a liquid crystal display panel, an organic light emitting display panel, or an electrophoretic display panel, etc. Hereinafter, the case where the display panel 100 is an organic light emitting display panel will be described, however, embodiments of the present disclosure are not limited thereto.

According to an embodiment, the panel driver 200 provides signals, voltages, etc., for displaying an image on the display panel 100. The panel driver 200 is disposed on the encapsulation layer of the display panel 100, and is electrically connected to the pixels PX through a plurality of via lines 190 that pass through the encapsulation layer. The panel driver 200 is electrically connected to the pixel circuit of each of the pixels PX through the via lines 190. The panel driver 200 may overlap at least some of the pixels PX.

Figure 2:
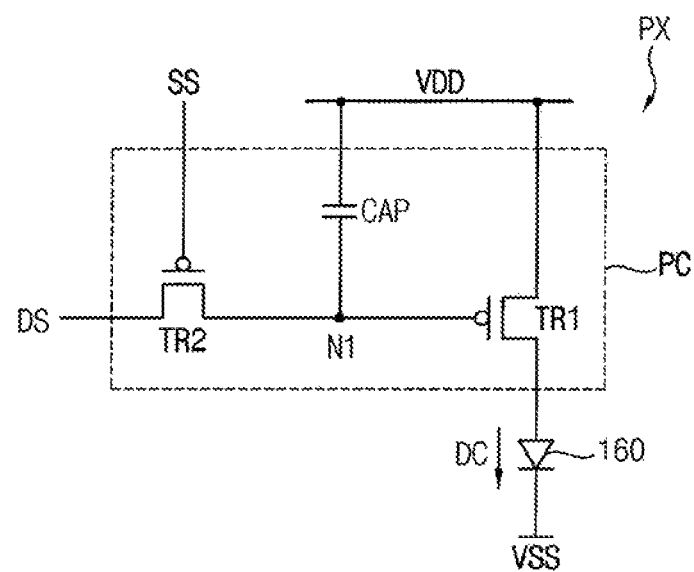
FIG. 2 is an equivalent circuit diagram of a pixel in FIG. 1.

FIG. 2 is an equivalent circuit diagram of the pixel PX in FIG. 1.

Referring to FIG. 2, according to an embodiment, each of the pixels PX includes a pixel circuit PC and a light emitting element 160 connected to the pixel circuit PC. The pixel circuit PC receives a scan signal SS, a data signal DS, and a first voltage VDD, generates a driving current DC, and transmits the driving current DC to the light emitting element 160. The light emitting element 160 receives a second voltage VSS, and emits light based on the driving current DC received from the pixel circuit PC. The pixel circuit PC includes at least one transistor and at least one capacitor that generate the driving current DC.

In an embodiment, the pixel circuit PC includes a first transistor TR1, a second transistor TR2, and a capacitor CAP. However, embodiments of the present disclosure are not limited thereto, and in other embodiments, the pixel circuit PC includes three or more transistors or two or more capacitors.

According to an embodiment, a gate electrode of the first transistor TR1 is connected to a first node N1. The first voltage VDD is applied to a source electrode of the first transistor TR1, and a drain electrode of the first transistor TR1 is connected to the light emitting element 160. The first transistor TR1 generates the driving current DC based on a voltage difference between the gate electrode and the source electrode of the first transistor TR1, and transmits the driving current DC to the light emitting element 160.

According to an embodiment, the scan signal SS is applied to a gate electrode of the second transistor TR2. The data signal DS is applied to a source electrode of the second transistor TR2, and a drain electrode of the second transistor TR2 is connected to the first node N1. The second transistor TR2 transmits the data signal DS to the first node N1 based on the scan signal SS.

According to an embodiment, the first voltage VDD is applied to a first electrode of the capacitor CAP, and a second electrode of the capacitor CAP is connected to the first node N1. The capacitor CAP maintains the voltage between the gate electrode and the source electrode of the first transistor TR1 when the second transistor TR2 is turned off, so that the light emitting element 160 can emit light.

According to an embodiment, a first electrode of the light emitting element 160 is connected to the pixel circuit PC, and the second voltage VSS is applied to a second electrode of the light emitting element 160. The second voltage VSS is less than the first voltage VDD. The light emitting element 160 emits light based on the driving current DC received from the pixel circuit PC.

Figure 3:
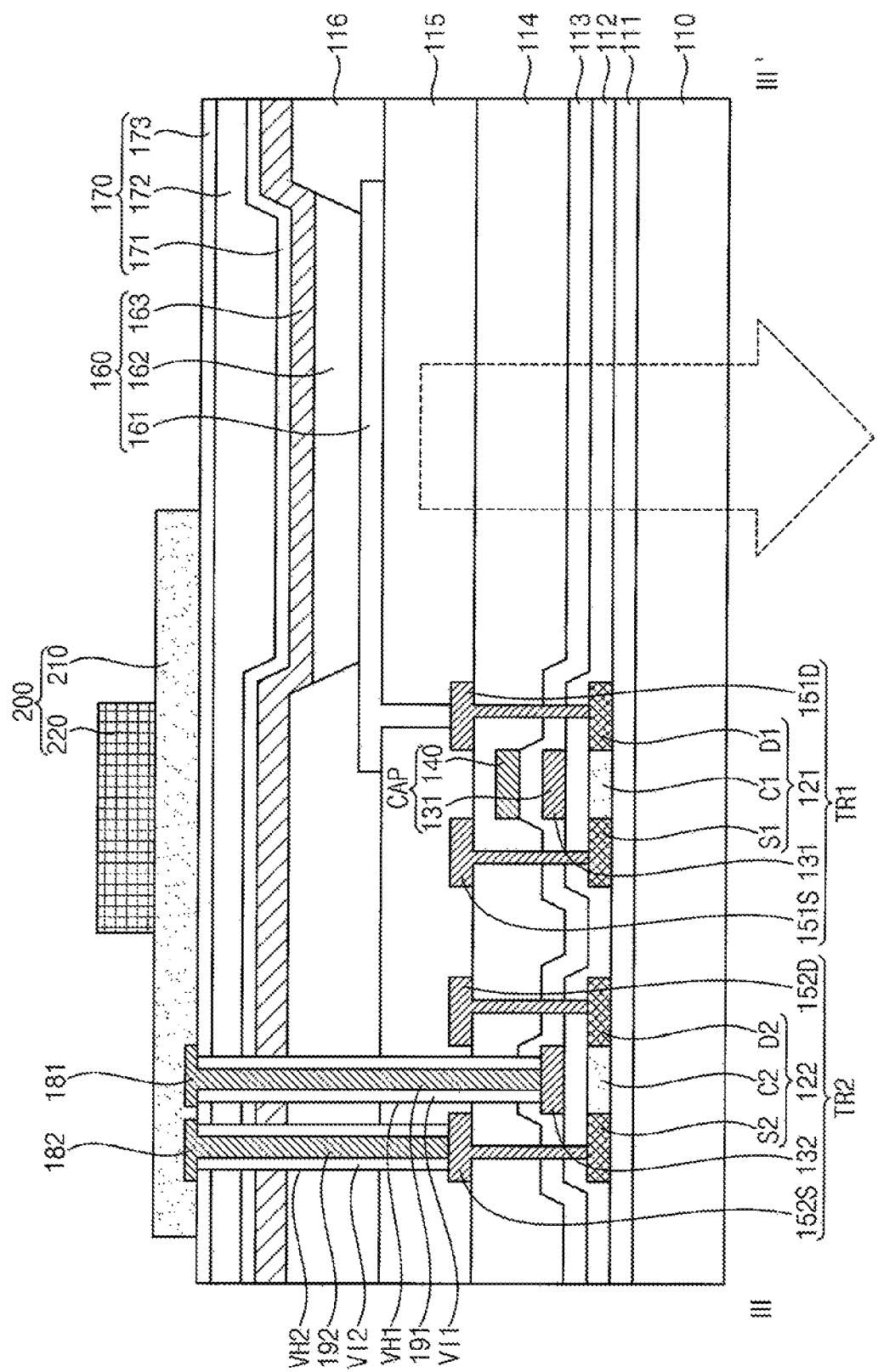
FIG. 3 is a cross-sectional view of a display device in FIG. 1.

FIG. 3 is a crus-sectional view of the display device DD in FIG. 1. For example, FIG. 3 is a cross-sectional view taken along a line III-III'.

Referring to FIGS. 1, 2, and 3, according to an embodiment, the display device DD may include a substrate 110, the pixel circuit PC disposed on the substrate 110, a light emitting element 160 connected to the pixel circuit PC, an encapsulation layer 170 that covers the light emitting element 160, and a panel driver 200 disposed on the encapsulation layer 170. The pixel circuit PC includes the first transistor TR1, the second transistor TR2, and the capacitor CAP.

According to an embodiment, the substrate 110 is a transparent insulating substrate that includes one of glass, quartz, or plastic, etc. In an embodiment, the substrate 110 includes a first flexible layer, a first barrier layer disposed on the first flexible layer, a second flexible layer disposed on the first barrier layer, and a second barrier layer disposed on the second flexible layer. The first flexible layer and the second flexible layer include an organic insulation material such as polyimide (PI), etc., and the first barrier layer and the second barrier layer include an inorganic insulation material such as silicon oxide, silicon nitride, or amorphous silicon, etc.

According to an embodiment, a buffer layer 111 is disposed on the substrate 110. The buffer layer 111 blocks impurities such as oxygen or moisture, etc., from permeating into the substrate 110. Further, the buffer layer 111 provides a planarized upper surface over the substrate 110. The buffer layer 111 includes an inorganic insulation material, such as silicon oxide, silicon nitride, or silicon oxynitride, etc. Alternatively, in other embodiments, the buffer layer 111 is omitted.

According to an embodiment, a first active layer 121 and a second active layer 122 are disposed on the, buffer layer 111. The first active layer 121 and the second active layer 122 are formed of amorphous silicon, polysilicon, or an oxide semiconductor, etc. The first active layer 121 includes a first source region S1, a first drain region D1, and a first channel region C1 disposed between the first source region S1 and the first drain region D1. The second active layer 122 includes a second source region S2, a second drain region 132, and a second channel region C2 disposed between the second source region S2 and the second drain region D2. The first source region S1, the first drain region D1, the second source region S2, and the second drain region 132 are doped with P-type or N-type impurities.

According to an embodiment, a gate insulation layer 112 is disposed on the first active layer 121 and the second active layer 122. The gate insulation layer 112 covers the first active layer 121 and the second active layer 122, and is disposed on the buffer layer 111. A first gate electrode 131 and a second gate electrode 132 are disposed on the gate insulation layer 112 over the first active layer 121 and the second active layer 122, respectively. The gate insulation layer 112 insulates the first gate electrode 131 from the first active layer 121, and insulates the second gate electrode 112 from the second active layer 122. The gate insulation layer 112 includes an inorganic insulation material such as silicon oxide, silicon nitride, or silicon oxynitride, etc.

According to an embodiment, the first gate electrode 131 overlaps the first channel region C1 of the first active layer 121, and the second gate electrode 132 overlaps the second channel region C2 of the second active layer 122. The first gate electrode 131 and the second gate electrode 132 include a conductive material such as molybdenum (Mo) or copper (Cu), etc.

According to an embodiment, a first insulation interlayer 113 is disposed on the gate insulation, layer 112, the first gate electrode 131 and the second gate electrode 132. The first insulation interlayer 113 covers the first gate electrode 131 and the second gate electrode 132. The first insulation interlayer 113 insulates a capacitor electrode 140 disposed on the first gate electrode 131 from the first gate electrode 131. In an embodiment, the first insulation interlayer 113 includes an inorganic insulation material such as silicon oxide, silicon nitride, or silicon oxynitride, etc.

According to an embodiment, the capacitor electrode 140 is disposed on the, first insulation interlayer 113, The capacitor electrode 140 overlaps the first gate electrode 131. The capacitor electrode 140 includes a conductive material such as molybdenum (Mo) or copper (Cu), etc. The first gate electrode 131 and the capacitor electrode 140 form the capacitor CAP.

According to an embodiment, a second insulation interlayer 114 is disposed on the first insulation interlayer 113 and the capacitor electrode 140. The second insulation interlayer 114 covers the capacitor electrode 140. The second insulation interlayer 114 insulates a first source electrode 151S and a first drain electrode 151D disposed on the capacitor electrode 140 from the capacitor electrode 140. In an embodiment, the second insulation interlayer 114 includes an inorganic insulation material such as silicon oxide, silicon nitride, or silicon oxynitride, etc., or an organic insulation material such as polyimide (PI), etc.

According to an embodiment, the first source electrode 151S, the first drain electrode 151D, a second source electrode 152S, and a second drain electrode 152D are disposed On the second insulation interlayer 114. The first source electrode 151S and the first drain electrode 151D are connected to the first source region S1 and the first drain region D1 of the first active layer 121, respectively. For example, the first source electrode 151S and the first drain electrode 151D respectively contact the first some region S1 and the first drain region D1 through contact holes that penetrate the gate insulation layer 112, the first insulation interlayer 113, and the second insulation interlayer 114. The second source electrode 152S and the second drain electrode 152D are connected to the second source region S2 and the second drain region D2 of the second active layer 122, respectively. For example, the second source electrode 152S and the second drain electrode 152D respectively contact the second source region S2 and the second drain region D2 through contact holes that penetrates the gate insulation layer 112, the first insulation interlayer 113, and the second insulation interlayer 114. The first source electrode 151S, the first drain electrode 151D, the second source electrode 152S, and the second drain electrode 152D each include a conductive material such as aluminum (Al), titanium (Ti), or copper (Cu), etc.

According to an embodiment, the first active layer 121, the first gate electrode 131, the first source electrode 151S, and the first drain electrode 151D form the first transistor TR1. The second active layer 122, the second gate electrode 132, the second source electrode 152S, and the second drain electrode 152D form the second transistor TR2.

According to an embodiment, a planarization layer 115 is disposed on the second insulation interlayer 114, the first source electrode 151S, the first drain electrode 151D, the second source electrode 152S, and the second drain electrode 152D. The planarization layer 115 covers the first source electrode 151S, the first drain electrode 151D, the second source electrode 152S, and the second drain electrode 152D. The planarization layer 115 provides a planarized upper surface over the pixel circuit PC. The planarization layer 115 includes an organic insulation material such as polyimide (PI), etc.

According to an embodiment, a pixel electrode 161 is disposed on the planarization layer 115, The pixel electrode 161 is connected to the first transistor TR1. For example, the pixel electrode 161 contacts the first drain electrode 151D of the first transistor TR1 through a contact hole that penetrates the planarization layer 115. The pixel electrode 161 includes a conductive material such as metal, an alloy, or a transparent conductive oxide, etc.

According to an embodiment, a pixel defining layer 116 is disposed on the planarization layer 115 and the pixel electrode 161. The pixel defining layer 116 covers the pixel electrode 161. The pixel defining layer 116 has a pixel opening that exposes at least a portion of the pixel electrode 161. In an embodiment, the pixel opening exposes a center portion of the pixel electrode 161, and the pixel defining layer 116 covers a peripheral portion of the pixel electrode 161. The pixel defining layer 116 includes an organic insulation material such as polyimide (PI), etc.

According to an embodiment, an emission layer 162 is disposed on the pixel electrode 161. The emission layer 162 is disposed on the portion of the pixel electrode 161 that is exposed by the pixel opening. The emission layer 162 includes an organic light emitting material.

In an embodiment, the organic light emitting material may include low molecular weight organic compounds or high molecular weight organic compounds. For example, the low molecular weight organic compounds include copper phthalocyanine, N,N'-diphenylbenzidine, or tris-(8-hydroxyquinoline)aluminum, etc., and the high molecular weight organic compounds include poly(3,4-ethylenedioxythiophene), poly-phenylenevinylene, or polyfluorene, etc.

According to an embodiment, a common electrode 163 is disposed on the pixel defining layer 116 and on the emission layer 162. The common electrode 163 includes a conductive material such as metal, alloy, or a transparent conductive oxide, etc. The pixel electrode 161, the emission layer 162, the common electrode 163 form the light emitting element 160.

In an embodiment, the pixel electrode 161 transmits light, and the common electrode 163 reflects light. In other words, the pixel electrode 161 is provided as a transmitting electrode, and the common electrode 163 is provided as a reflecting electrode. In such an embodiment, light generated from the emission layer 162 is reflected by the common electrode 163, and the light propagates through the pixel electrode 161 and is emitted toward the substrate 110.

In an embodiment, the pixel electrode 161 and the emission layer 162 of the light emitting element 160 do not overlap the pixel circuit PC, so that the light emitting element 160 does not overlap the pixel circuit PC. For example, the emission layer 162 does not overlap the first transistor TR1, the second transistor TR2, and the capacitor CAP. The first transistor TR1, the second transistor TR2, and the capacitor CAP of the pixel circuit PC include conductive materials. If the light emitting element 160 overlaps the pixel circuit PC, light emitted toward the substrate 110 from the light emitting element 160 would be reflected or refracted by the pixel circuit PC. However, in a present embodiment, the light emitting element 160 does not overlap the pixel circuit PC, so that light emitted from the light emitting element 160 propagates toward the substrate 110 through the planarization layer 115, the second insulation interlayer 114, the first insulation interlayer 113, the gate insulation layer 112, and the buffer layer 111. In other embodiments, the common electrode 163 also does not overlap the pixel circuit PC, so that the entire light emitting element 160 does not overlap the pixel circuit PC.

According to an embodiment, the encapsulation layer 170 is disposed on the common electrode 163. The encapsulation layer 170 covers the light emitting element 160 and protects the light emitting element 160 from impurities such as oxygen or moisture, etc.

According to an embodiment, the encapsulation layer 170 includes at least one inorganic encapsulation layer and at least one organic encapsulation layer. The inorganic encapsulation layer includes silicon nitride or silicon oxynitride, etc., and the organic encapsulation layer includes an epoxy-based resin, an acryl-based resin, or an polyimide-based resin, etc.

In an embodiment, the encapsulation layer 170 includes a first inorganic encapsulation layer 171, an organic encapsulation layer 172, and a second inorganic encapsulation layer 173. The first inorganic encapsulation layer 171 is disposed on the common electrode 163. The first inorganic encapsulation layer 171 is formed along a profile thereunder, therefore, the first inorganic encapsulation layer 171 has an uneven upper surface.

According to an embodiment, the organic encapsulation layer 172 is disposed on the first inorganic encapsulation layer 171. The organic encapsulation layer 172 has a planarized upper surface.

According to an embodiment, the second inorganic encapsulation layer 173 is disposed on the organic encapsulation layer 172. The second inorganic encapsulation layer 173 is formed along a profile thereunder, therefore, the second inorganic encapsulation layer 173 has a planarized upper surface. The second inorganic encapsulation layer 173 extends beyond the organic encapsulation layer 172, and contacts the first inorganic encapsulation layer 171 outside the manic encapsulation layer 172.

According to an embodiment, the panel driver 200 is disposed on the encapsulation layer 170. The panel driver 200 is electrically connected to the pixel circuit PC through the via lines 190.

In an embodiment, the panel driver 200 includes a scan driver and a data driver. The scan driver generates the scan signals SS, and the data driver generates the data signals DS. The panel driver 200 provides the scan signals SS and the data signals DS to the pixel circuit PC.

In an embodiment, the panel driver 200 overlaps the light emitting element 160. Because the light emitting element 160 emits light toward the substrate 110, as indicated by the dotted arrow in the figure, the panel driver 200 does not affect light emitted from the light emitting element 160, even though the panel driver 200 overlaps the light emitting element 160.

According to an embodiment, the panel driver 200 is connected to the pixel circuit PC through the via lines 190 that penetrate the encapsulation layer 170. In an embodiment, the via lines 190 include a first via line 191 and a second via line 192. The first via line 191 is connected to the second gate electrode 132 of the second transistor TR2, and the second via line 192 is connected to the second source electrode 152S of the second transistor TR2. For example, the first via line 191 contacts the second gate electrode 132 through a first via hole VH1 that penetrates the first insulation interlayer 113, the second insulation interlayer 114, the planarization layer 115, the pixel defining layer 116, the common electrode 163, and the encapsulation layer 170. Further, the second via line 192 contacts the second source electrode 152S through a second via hole VH2 that penetrates the planarization layer 115, the pixel defining layer 116, the common electrode 163, and the encapsulation layer 170. The first via line 191 transmits the, scan signal SS to the second gate electrode 132, and the second via line 192 transmits the data signal DS to the second source electrode 152S.

In an embodiment, the first via hole VH1 and the second via hole VH2 are substantially simultaneously formed after the formation of the encapsulation layer 170, and each of the first via hole VH1 and the second via hole VH2 is filled with a conductive material to form the first via line 191 and the second via line 192.

In an embodiment, via insulation portions are formed between the via lines 190 and at least the common electrode 163. For example, a first via insulation portion VI1 is formed between the first via line 191 and the first insulation interlayer 113, between the first via line 191 and the second insulation interlayer 114, between the first via line 191 and the planarization layer 115, between the first via line 191 and the pixel defining layer 116, between the first via line 191 and the common electrode 163, and between the first via line 191 and the encapsulation layer 170. Further, a second via insulation portion VI2 is formed between the second via line 192 and the planarization layer 115, between the second via line 192 and the pixel defining layer 116, between the second via line 192 and the common electrode 163, and between the second via line 192 and the encapsulation layer 170. The first via insulation portion VI1 and the second via insulation portion VI2 may each include an inorganic insulation material or an organic insulation material. The first via insulation portion VI1 prevents the first via line 191 from being electrically connected to the common electrode 163, and the second via insulation portion VI2 prevents the second via line 192 from being electrically connected to the common electrode 163.

In an embodiment, each of the first via hole VH1 and the second via hole VH2 is filled with an insulation material after forming the first via hole VH1 and the second via hole VH2, and through holes are respectively formed through the insulation material in the first via hole VH1 and the second via hole VH2 to form the first via insulation portion VI1 and the second via insulation portion VI2. Then, each of the through holes respectively formed in the first via insulation portion VI1 and the second via insulation portion VI2 is filled with a conductive material to form the first via line 191 and the second via line 192.

In an embodiment, the panel driver 200 includes a printed circuit board 210 disposed on the encapsulation layer 170 and a driving chip 220 disposed on the printed circuit board 210. The driving chip 220 generates signals or voltages, etc., for the display panel 100, and the printed circuit board 210 electrically connects the driving chip 220 to the display panel 100 to transmit the signals or voltages, etc., generated by the driving chip 220 to the display panel 100.

In an embodiment, pads are disposed between the encapsulation layer 170 and the printed circuit board 210. The pads connect the via lines to the printed circuit board 210. In such an embodiment, the panel driver 200 may be attached on the pads by e.g., a tap bonding process or the like.

According to an embodiment, the pads include a first pad 181 and a second pad 182. The first pad 181 connects the first via line 191 to the printed circuit board 210, and the second pad 182 connects the second via line 192 to the printed circuit board 210.

In an embodiment, each of the via lines and each of the pads are integrally formed. For example, the first via line 191 and the first pad 181 are integrally formed, and the second via line 192 and the second pad 182 are integrally formed.

According to an embodiment, the common electrode 163 is relatively thick. In an embodiment, a thickness of the common electrode 163 is greater than a thickness of the pixel electrode 161. The common electrode 163 is relatively thick, so that the panel driver 200 can be stably formed on the encapsulation layer 170 disposed on the common electrode 163 when the panel driver 200 is attached on the encapsulation layer 170 by a tap bonding process, etc. Further, the common electrode 163 is relatively thick, so that a voltage drop of the second voltage VSS transmitted through the common electrode 163 can be reduced or substantially prevented.

In an embodiment of the present invention, the panel driver 200 is disposed on a front surface of the display panel 100, such as on the encapsulation layer 170 of the display panel 100, and an image is displayed toward a rear surface of the display panel 100, i.e., toward the substrate 110 of the display panel 100, so that a substantially entire rear surface of the display device DD functions as a display region. Accordingly, an area of a bezel or a non-display region of the display device DD can be reduced.

Figure 4:
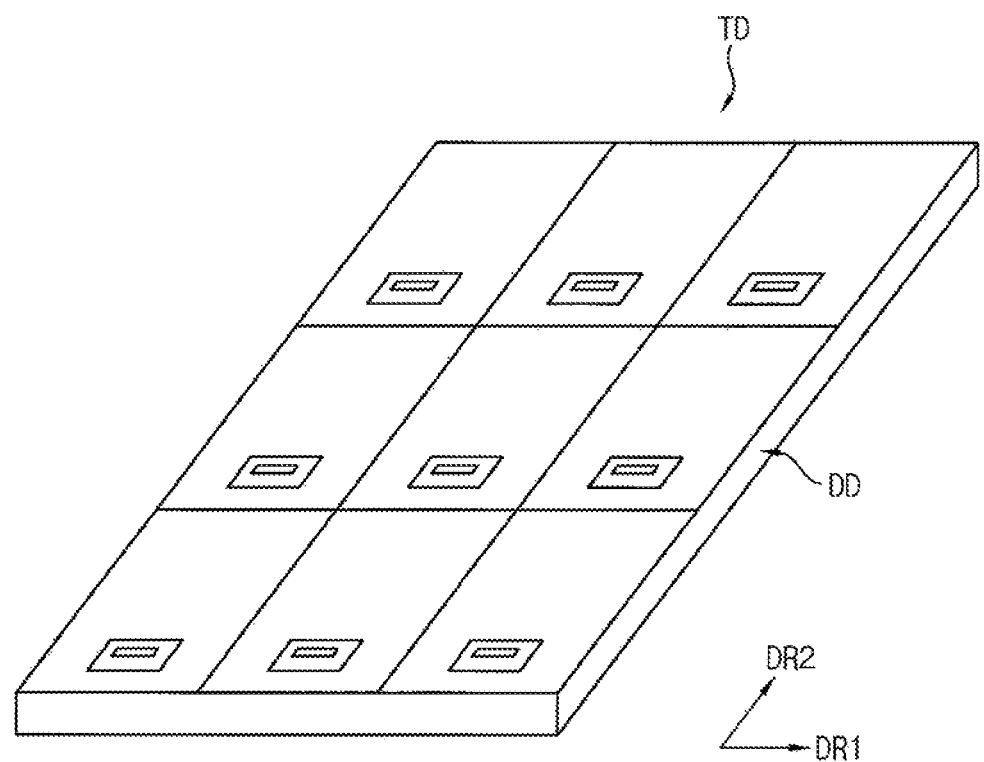
FIG. 4 is a perspective view of a tiled display device according to an embodiment of the present disclosure.

FIG. 4 is a perspective view of a tiled display device according to an embodiment of the present invention.

Referring to FIGS. 1 and 4, a tiled display device TD according to an embodiment of the present disclosure includes a plurality of display devices DD combined with each other.

According to an embodiment, each of the display devices DD that form the tiled display device TD is the display device DD according to an embodiment described with reference to FIGS. 1 to 3. Accordingly, the tiled display device TD includes a plurality of display panels 100 connected to each other and a plurality of panel drivers 200 respectively disposed on front surfaces of the display panels 100.

In an embodiment, the display panels 100 do not overlap each other. For example, the display devices DD are arranged as a matrix along the first direction DR1 and the second direction DR2. The images displayed by each of the display devices DD toward a rear surface direction form a large screen image of the tiled display device TD.

As described above, according to an embodiment, the panel driver 200 is disposed on a front surface of the display panel 100, such as the encapsulation layer of the display panel 100, so that an area of the bezel or the non-display region of the display device DD can be reduced. Accordingly, a user will not perceive a boundary between the display devices DD in the tiled display device TD. Therefore, image quality of the tiled display device TD is improved, and the tiled display device TD can provide a large screen image in which a boundary between the display devices DD is not perceived.

A display device according to the embodiments can be incorporated into a display device included in a computer, a notebook, a mobile phone, a smartphone, a smart pad, a PMP, a PDA, or an MP3 player, etc.

Although a display device and a tiled, display device according to exemplary embodiments has been described with reference to the drawings, exemplary embodiments are examples, and cant be modified and changed by a person having ordinary knowledge in the relevant technical field without departing from the technical spirit described in the following claims.

What is claimed is:

1. A display device, comprising:
    a substrate;
    a pixel circuit disposed on the substrate;
    a light emitting element connected to the pixel circuit and that emits light toward the substrate; and
    a panel driver that is electrically connected to the pixel circuit through a via line,
    wherein the light emitting element does not overlap the pixel circuit,
    wherein the light emitting element includes:
        a pixel electrode connected to the pixel circuit;
        an emission layer disposed on the pixel electrode; and
        a common electrode disposed on the emission layer,
    wherein the via line penetrates the common electrode, and
    wherein a via insulation portion is formed between the via line and the common electrode.

2. The display device of claim 1, wherein the substrate is transparent.

3. The display device of claim 1, wherein
    the pixel electrode transmits light, and
    the common electrode reflects light.

4. The display device of claim 1,
wherein a thickness of the common electrode is greater than a thickness of the pixel electrode.

5. The display device of claim 1,
wherein the pixel circuit includes a transistor, and
wherein the transistor includes:
an active layer that includes a channel region, a source region, and a drain region;
a gate electrode that overlaps the channel region; and a source electrode and a drain electrode respectively connected to the source region and the drain region.

6. The display device of claim 5, wherein the via line includes:
a first via line that transmits a scan signal; and
a second via line that transmits a data signal.

7. The display device of claim 6, wherein
the first via line is connected to the gate electrode, and
the second via line is connected to the source electrode.

8. The display device of claim 1,
wherein the panel driver overlaps the light emitting element.

9. The display device of claim 1, further comprising
an encapsulation layer that covers the light emitting element,
wherein the panel driver is disposed on the encapsulation layer and the via line penetrates the encapsulation layer.

10. The display device of claim 9, wherein the panel driver includes:
a printed circuit board disposed on the encapsulation layer; and
a driving chip disposed on the printed circuit board.

11. The display device of claim 10, further comprising
a pad disposed between the encapsulation layer and the printed circuit board,
wherein the pad connects the via line to the printed circuit board.

12. The display device of claim 11,
wherein the via line and the pad are integrally formed.

13. The display device of claim 9, wherein the encapsulation layer includes:
a first inorganic encapsulation layer that covers the light emitting element;
an organic encapsulation layer disposed on the first inorganic encapsulation layer; and
a second inorganic encapsulation layer disposed on the organic encapsulation layer.

14. A display device, comprising:
a substrate;
a plurality of pixels disposed on the substrate, wherein each pixel emits light toward the substrate;
an encapsulation layer that covers the plurality of pixels; and
a panel driver disposed on the encapsulation layer and that is electrically connected to the plurality of pixels through a plurality of via lines that penetrate the encapsulation layer,
wherein each of the plurality of pixels includes a light emitting element that emits light toward the substrate,
wherein the light emitting element includes:
a pixel electrode;
an emission layer disposed on the pixel electrode; and
a common electrode disposed on the emission layer,
wherein each of the plurality of via lines penetrates the common electrode, and
wherein a via insulation portion is formed between each of the plurality of via lines and the common electrode.

15. The display device of claim 14, wherein each of the plurality of pixels includes:
a pixel circuit disposed on the substrate and that is connected to the pixel electrode of the light emitting element.

16. The display device of claim 15,
wherein the panel driver is electrically connected to the pixel circuit of each of the plurality of pixels through each of the plurality of via lines.

17. A tiled display device, comprising:
a plurality of display panels connected to each other and each including
a substrate,
a pixel circuit disposed on the substrate,
a light emitting element connected to the pixel circuit that emits light
toward the substrate, and
an encapsulation layer that covers the light emitting element,
wherein the light emitting element includes:
a pixel electrode connected to the pixel circuit;
an emission layer disposed on the pixel electrode; and
a common electrode disposed on the emission layer; and
a plurality of panel drivers,
wherein each panel driver is disposed on the encapsulation layer and is electrically connected to the pixel circuit through a respective via line that penetrates the encapsulation layer,
wherein the via line penetrates the common electrode, and
wherein a via insulation portion is formed between the via line and the common electrode.

18. The tiled display device of claim 17,
wherein the plurality of display panels do not overlap to each other.

* * * * *